(12) United States Patent
Kruizinga et al.

(10) Patent No.: US 6,498,351 B1
(45) Date of Patent: Dec. 24, 2002

(54) ILLUMINATION SYSTEM FOR SHAPING EXTREME ULTRAVIOLET RADIATION USED IN A LITHOGRAPHIC PROJECTION APPARATUS

(75) Inventors: Borgert Kruizinga, Zoetermeer (NL); Isabel Escudero Sanz, Nootdorp (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/521,599

(22) Filed: Mar. 9, 2000

(30) Foreign Application Priority Data

Mar. 12, 1999 (EP) .............................................. 99200750

(51) Int. Cl.[7] .............................. A61N 5/00; G21G 5/00; G21R 5/10
(52) U.S. Cl. ................................. 250/492.2; 250/492.1; 250/504 R
(58) Field of Search ........................... 250/458.1, 492.1, 250/492.2, 461.1, 492.22, 504 R

(56) References Cited

U.S. PATENT DOCUMENTS

5,896,438 A * 4/1999 Miyake et al. ................ 378/34
6,198,793 B1 * 3/2001 Schultz et al. ................ 378/34

* cited by examiner

*Primary Examiner*—John R. Lee
*Assistant Examiner*—David A. Vanore
(74) *Attorney, Agent, or Firm*—Pillsbury Winthrop LLP

(57) ABSTRACT

In a lithographic projection apparatus, extreme ultraviolet radiation, e.g., of a wavelength of 13 nm, is generated by an undulator 10 in an electron storage ring. The radiation is collected by a first relay mirror 13, and an image of the source waist is formed at an intermediate plane. At the intermediate plane, a first scattering mirror 14 is provided to increase the divergence of the radiation beam in at least one plane. A second relay mirror 15 images the first scattering mirror onto the entrance pupil 18 of the projection system of the lithographic apparatus. A second scattering mirror 16 folds the projection beam onto the mask 17 and further increases the divergence of the radiation beam.

20 Claims, 3 Drawing Sheets

ILLUMINATION SYSTEM FOR SHAPING EXTREME ULTRAVIOLET RADIATION USED IN A LITHOGRAPHIC PROJECTION APPARATUS

FIELD OF THE INVENTION

The present invention relates to illumination systems, e.g. for extreme ultraviolet radiation. More particularly, the invention relates to the application of such a device in lithographic projection apparatus comprising:
- an illumination system constructed and arranged to supply a projection beam of radiation;
- a first object table provided with a mask holder constructed to hold a mask;
- a second object table provided with a substrate holder constructed to hold a substrate; and
- a projection system constructed and arranged to image an irradiated portion of the mask onto a target portion of the substrate.

BACKGROUND OF THE INVENTION

For the sake of simplicity, the projection system may hereinafter be referred to as the "lens"; however, this term should be broadly interpreted as encompassing various types of projection systems, including refractive optics, reflective optics, catadioptric systems, and charged particle optics, for example. In addition, the first and second object tables may be referred to as the "mask table" and the "substrate table", respectively. Further, the lithographic Apparatus may be of a type having two or more mask tables and/or two or more substrate tables. In such "multiple stage" devices the additional tables may be used in parallel, or preparatory steps may be carried out on one or more stages while one or more other stages are being used for exposures. Twin stage lithographic apparatus are described in International Patent Applications WO 98/28665 and WO 98/40791, for example.

Lithographic projection apparatus can be used, for example, in the manufacture of integrated circuits (ICs). In such a case, the mask (reticle) may contain a circuit pattern corresponding to an individual layer of the IC, and this pattern can be imaged onto a target area (die) on a substrate (silicon wafer) which has been coated with a layer of photosensitive material (resist). In general, a single wafer will contain a whole network of adjacent dies which are successively irradiated via the reticle, one at a time. In one type of lithographic projection apparatus, each die is irradiated by exposing the entire reticle pattern onto the die at once, such an apparatus is commonly referred to as a wafer stepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally <1), the speed V at which the wafer table is scanned will be a factor M times that at which the reticle table is scanned. More information with regard to lithographic devices as here described can be gleaned from International Patent Application WO 97/33205.

In a lithographic apparatus, the size of features that can be imaged onto the wafer is limited by the wavelength of the projection radiation. To produce integrated circuits with a higher density of devices, and hence higher operating speeds, it is desirable to be able to image smaller features. Whilst most current lithographic projection apparatus employ ultraviolet light generated by mercury lamps or excimer lasers, it has been proposed to use shorter wavelength radiation of around 13nm. Such radiation is termed extreme ultraviolet (EUV) or soft x-ray and possible sources include laser plasma sources or synchrotron radiation from electron storage rings. An outline design of a lithographic projection apparatus using synchrotron radiation is described in "Synchrotron radiation sources and condensers for projection x-ray lithography", J. B. Murphy et al, Applied Optics Vol. 32 No. 24 pp 6920–6929 (1993). Although the synchrotron radiation emitted by a storage ring is well confined to the plane containing the circulating electron beam, it is emitted in all directions in that plane, and to generate a sufficiently intense projection beam it is necessary to collect synchrotron radiation from a wide range of angles. This results in an undesirably large device overall and in particular requires the provision of large collection mirrors.

So-called "undulators" and "wigglers" have been proposed as an alternative source of extreme ultraviolet radiation. In these devices, a beam of electrons traveling at high, usually relativistic, speeds, e.g. in a storage ring, is caused to traverse a series of regions in which magnetic fields perpendicular to the beam velocity are established. The directions of the magnetic field in adjacent regions are mutually opposite, so that the electrons follow an undulating path. The transverse accelerations of the electrons following the undulating path causes the emission of Maxwell radiation perpendicular to the direction of the accelerations, i.e. in the direction of the undeviated path. Such radiation sources generally have a moderate or small étendue, as compared to laser plasma sources, for example, which have a large étendue.

The term 'étendue' refers to the product of the size of the source and the solid emission angle.

It is an object of the present invention to provide an optical system that may be used to shape radiation emitted from a radiation source, especially extreme ultraviolet radiation, into an arch- or ring-shaped projection beam for a lithographic projection apparatus.

According to the present invention there is provided lithographic projection apparatus for imaging a mask pattern in a mask onto a substrate, the apparatus comprising:
- an illumination system constructed and arranged to supply a projection beam of radiation;
- a first object table provided with a mask holder constructed to hold a mask;
- a second object table provided with a substrate holder constructed to hold a substrate; and
- a projection system constructed and arranged to image an irradiated portion of the mask onto a target portion of the substrate; characterized in that said illumination system comprises:
- scattering means constructed and arranged to control the divergence of said projection beam, said scattering means comprising a one-dimensional array of curved reflecting elements each conforming to a curved surface such as would reflect a narrow and collimated incident beam into a curved fan.

The present invention therefore provides an illumination system which can be used in a lithography apparatus to provide an arch or ring field illumination for the reticle and also good filling of the entrance pupil of the projection system. Furthermore, the invention enables provision to be made for the location of field masks (REMA) and pupil masks (for the control of the filling factor) in the system.

The arch shape of the illumination at the reticle is due to the scattering mirror which is a one-dimensional (at least) array of, for example, toroidal, cylindrical or conical mirrors. For light sources of large étendue, the scattering mirror is preferably a matrix of mirrors, each being a one-dimensional array of toroidal, cylindrical or conical mirrors. The individual mirrors of the matrix can be individually oriented to concentrate the radiation in the projection beam. For light sources with small 6tendue, a second scattering mirror can be introduced into the system to control and improve pupil filling. The second scattering mirror can be a two-dimensional array of aspherical mirrors.

In various embodiments of the invention, relay (or imaging) mirrors can be provided. For example, a relay or collector mirror in front of the first scattering mirror can be provided to collect light from the source and direct it to the first scattering mirror at an appropriate angle of incidence. Relay mirrors behind the first scattering mirror can be provided to produce conjugate planes for field and pupil masking, to direct the light to the reticle and the entrance pupil and to preserve the shape of the arched beam reflected by the first scattering mirror so that the illumination at the reticle has the shape of a ring field.

The second scattering mirror, if provided, may be combined with a relay mirror into a single element. Such a combined element will comprise a two-dimensional array of spherical or aspherical mirrors, effective to perform the scattering function, overlaid on a curved surface, effective to perform the focusing function. The use of fewer elements is advantageous in reducing reflection losses.

The radiation source which provides the projection beam may be an undulator or a wiggler, which emits radiation of a narrow range of wavelengths in a beam with a small divergence angle, or a laser plasma source, which emits radiation into a wider range. The simple collection optics of the invention, enable the provision of a powerful and well-shaped projection beam for a lithographic projection apparatus.

The present invention also provides a device manufacturing method using a lithography apparatus, the method comprising the steps of:

providing a substrate which is at least partially covered by a layer of energy-sensitive material;

providing a mask containing a pattern;

using a projection beam of radiation to project an image of at least part of the mask pattern onto a target area of the layer of energy-sensitive material; characterized in that:

the divergence of said projection beam is controlled in an illumination system of the lithography apparatus using scattering means comprising a one-dimensional array of curved reflecting elements each conforming to a curved surface such as would reflect a narrow and collimated incident beam into a curved fan.

In a manufacturing process using a lithographic projection apparatus according to the invention a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallisation, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing. The individual devices can then be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

BRIEF DESCRIPTION OF THE DRAWINGS

The present invention and its attendant advantages will be described below with reference to exemplary embodiments and the accompanying schematic drawings, in which.

In the various drawings, like parts are indicated by like references.

DETAILED DESCRIPTION OF THE PREFERRED EMBODIMENTS

Embodiment 1

Figure 1:
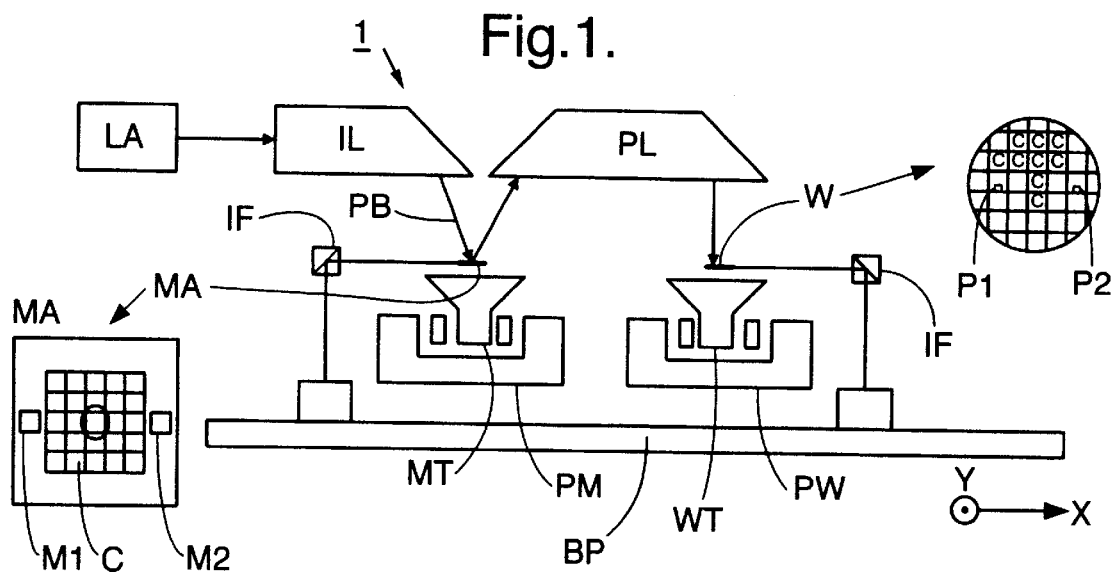
FIG. 1 depicts a lithographic projection apparatus according to a first embodiment of the invention.

FIG. 1 schematically depicts a lithographic projection apparatus 1 according to the invention. The apparatus comprises:

a radiation system LA, IL for supplying a projection beam PB of EUV radiation;

a first object table (mask table) MT provided with a mask holder for holding a mask MA (e.g. a reticle), and connected to first positioning means PM for accurately positioning the mask with respect to item PL;

a second object table (substrate table) WT provided with a substrate holder for holding a substrate W (e.g. a resist-coated silicon wafer), and connected to second positioning means PW for accurately positioning the substrate with respect to item PL;

a projection system ("lens") PL (e.g. a refractive or catadioptric system or a reflective system) for imaging an irradiated portion of the mask MA onto a target portion C (die) of the substrate W.

The radiation system comprises a source LA (e.g. an undulator or wiggler provided around the path of an electron beam in a storage ring or synchrotron) which produces a beam of radiation. This beam is passed along various optical components included in illumination system ("lens") IL (also referred to herein as illumination optics) so that the resultant beam PB is collected in such a way as to give illumination of the desired shape and intensity distribution at the entrance pupil of the projection system and the mask.

The beam PB subsequently impinges upon the mask MA which is held in the mask holder on the mask table MT. Having been selectively reflected by the mask MA, the beam PB passes through the lens PL, which focuses the beam PB onto a target area C of the substrate W. With the aid of the interferometric displacement measuring means IF and positioning means PW, the substrate table WT can be moved accurately, e.g. so as to position different target areas C in the path of the beam PB. Similarly, the positioning means PM and interferometric displacement measuring means IF can be used to accurately position the mask MA with respect to the path of the beam PB, e.g. after mechanical retrieval of the mask MA from a mask library. In general, movement of the object tables MT, WT will be realized with the aid of a long stroke module (course positioning) and a short stroke module (fine positioning), which are not explicitly depicted in FIG. 1.

The depicted apparatus can be used in two different modes:

In step mode, the mask table MT is kept essentially stationary, and an entire mask image is projected in one go (i.e. a single "flash") onto a target area C. The substrate table WT is then shifted in the x and/or y directions so that a different target area C can be irradiated by the beam PB;

In scan mode, essentially the same scenario applies, except that a given target area C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target area C can be exposed, without having to compromise on resolution.

Figure 2:
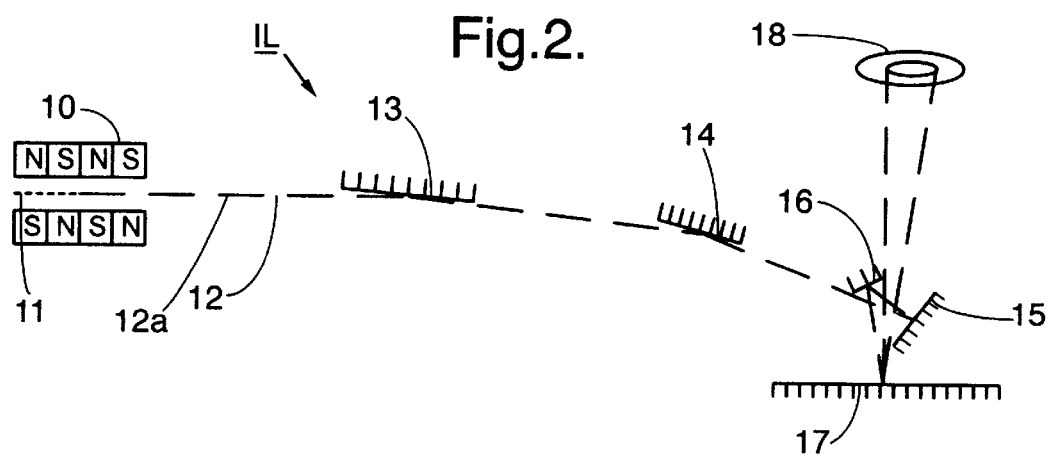
FIG. 2 is a diagram of relevant components of the illumination optics of the first embodiment.

As shown schematically in FIG. 2, illumination system IL receives radiation from an undulator or a wiggler 10, the radiation source, placed around the path of an electron beam 11 circulating in a storage ring or synchrotron (not shown). The undulator or wiggler 10 comprises a series of magnets (e.g. electromagnets) to generate regions of magnetic fields of alternating direction which cause the electron beam to follow an undulating path, thereby generating Maxwell radiation. The number and arrangement of regions, the magnetic field strength, as well as the electron beam size and speed may be selected as appropriate to generate the desired intensity and wavelength of radiation.

Illumination system IL collects the light from the source and directs it into the projection system PL after reflection at the mask. The mask is located at the object plane of the projection system. The illuminated area of the mask has the shape of a ring field. The imaging properties of the illumination system are such that, in the limiting case in which the scattering mirrors have zero power, the illumination optics produce an image of the source at the entrance pupil of the projection system. Thus the mask is the aperture stop of the condenser and the field stop of the projection system. The illumination system 2 comprises, along the light path of the projection beam 12, the following components:

first relay mirror 13 to image the beam waist 12a onto first scattering mirror 14, first scattering mirror 14 to disperse the light in a curved fan shape, second relay mirror 15 to image the first scattering mirror 14 onto the entrance pupil 18 of the projection system PL, second scattering mirror 16 to disperse the light to fill the entrance pupil of the projection system PL with the desired beam shape and cross-section, e.g. uniformly.

In this system the first and second relay mirrors are optimized to provide good imaging of the source at the first scattering mirror and at the entrance pupil of the projection system.

FIG. 2 also shows the mask 17 which selectively reflects the projection beam 12 into the entrance pupil 18 of the projection system PL.

Figure 3:
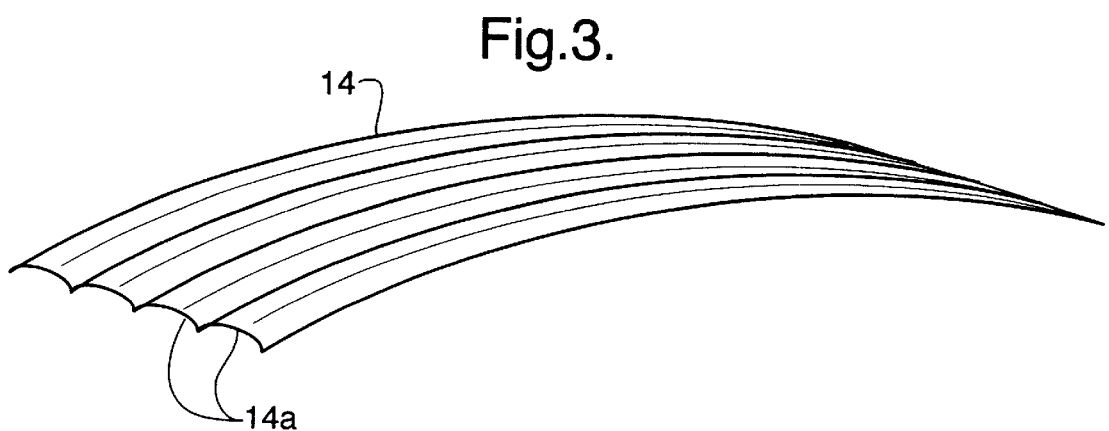
FIG. 3 is a perspective view of the first scattering mirror in the illumination optics of FIG. 2.
Figure 4:
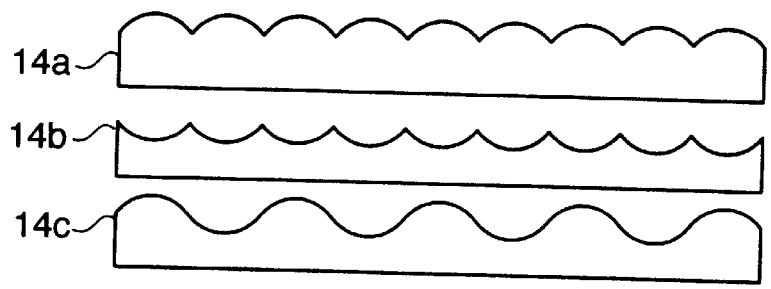
FIG. 4 is a view showing three alternative cross-sections for the first scattering mirror in the illumination optics of FIG. 2.

The first relay mirror 13 is toroidal in shape with the projection beam being reflected at a grazing angle towards the first scattering mirror 14 which is also a grazing incidence reflector. The first scattering mirror 14 is shown enlarged in FIG. 3 and comprises a one-dimensional array of toroidal mirror elements 14a; four are shown in FIG. 3 but the mirror may in practice comprise more, e.g. 6 or 12. (In this context, the term 'toroidal' indicates that the reflecting surface of the mirror conforms to only part of a toroidal surface.) The shape of each element of the array and the spacing between elements control the size and uniformity of illumination at the mask. Three alternative cross-sections for the first scattering mirror 14 are shown in FIG. 4. As can there be seen, the first scattering mirror 14 may comprise: all convex elements, shown as 14a; all concave elements, shown as 14b; or alternating concave and convex elements, shown as 14c. Other combinations may also be employed if desired. The angle of incidence on this scattering mirror is also a factor determining the radius of curvature of the ring field at the mask. In some embodiments, the elements of the first scattering mirror may be cylindrical or conical rather than toroidal. (Again, the terms 'cylindrical' and 'conical' indicate that the reflecting surfaces conform to only part of a cylindrical or conical surface, as the case may be.)

Figure 5:
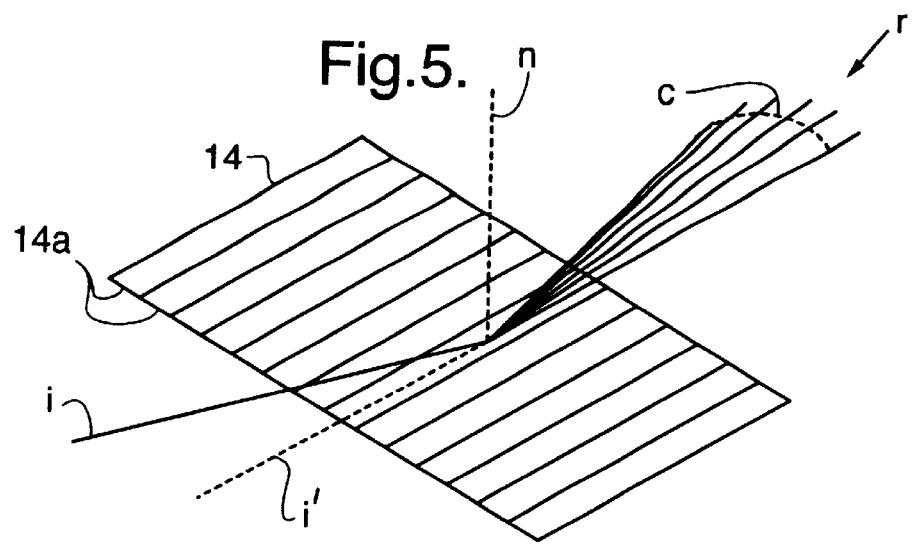
FIG. 5 is a view referred to in explaining the effect of the first scattering mirror.

The effect of the first scattering mirror 14 is shown in FIG. 5. For clarity, the mirror 14 is represented as planar in this figure and no attempt has been made to illustrate the curvature of the elements. However, the mirror will in fact be configured as described above. The effect of the mirror can be best appreciated by considering a narrow collimated beam i which is incident in a direction such that its projection i' onto the mirror plane is parallel to the axes of the toroidal elements 14a. Also, the angle of incidence from the normal n to beam i is large. As shown in FIG. 5, the reflected beam r is then a curved fan with a cross-section c in the shape of an arch corresponding to the surface profile of the element 14a and the angle of incidence of the projection beam.

The second relay mirror 15 is elliptical and relatively close to the mask 17. In other embodiments an ellipsoidal mirror may also be used. As well as imaging the first scattering mirror 14 onto the entrance pupil 18, it is a near-normal incidence mirror to fold the projection beam 12 to enable the mask to be conveniently oriented. The second scattering mirror 16 is similarly close to the second relay mirror 15 and the mask 17 and comprises a two-dimensional square or hexagonal array of concave or convex spherical, aspherical or toroidal mirrors on a flat substrate. The spacing, distribution (rectangular or hexagonal array), radius of curvature and shape of each component control the uniformity, filling factor and shape of illumination at the entrance pupil. These factors can therefore be selected to have the desired effect for a specific embodiment of the invention. The second scattering mirror 16 ensures that the entrance pupil 18 of the projection system is appropriately filled and that the angle of incidence of the projection radiation on the mask is appropriate. It should preferably be a small angle from normal incidence and in the present embodiment is about 5.49°. The second relay mirror and second scattering mirror are both near-normal incidence reflectors.

The second scattering mirror 16 may be exchangeable with mirrors of other configurations to control the filling factor and the shape of the illumination of the entrance pupil 18.

The mirror surfaces required in the invention are complex, but can be manufactured using known techniques. It is noted that certain surface irregularities in the mirrors can be tolerated, since this will generally result in a loss of power rather than a reduction in image quality.

The first and second scattering mirrors 14, 16 described above may be manufactured by polishing glass or metal substrates. Alternatively they may be formed by surface holograms or arrays of micro-components formed by direct electron beam exposure of photo-resist or x-ray lithography.

The parameters and dimensions of the optical system described above have been designed and selected for design criteria such as the specific mechanical envelope of the total system, the ring field shape and size, and the entrance pupil diameter and filling factor. It will be appreciated that the optimum dimensions and parameters will change or be scaled to match any changes to the design criteria.

In this embodiment, a field mask may be provided near the second scattering mirror and a pupil mask between the second scattering mirror and the second relay mirror. These components are omitted from FIG. 2 for the sake of clarity.

Embodiment 2

Figure 6:
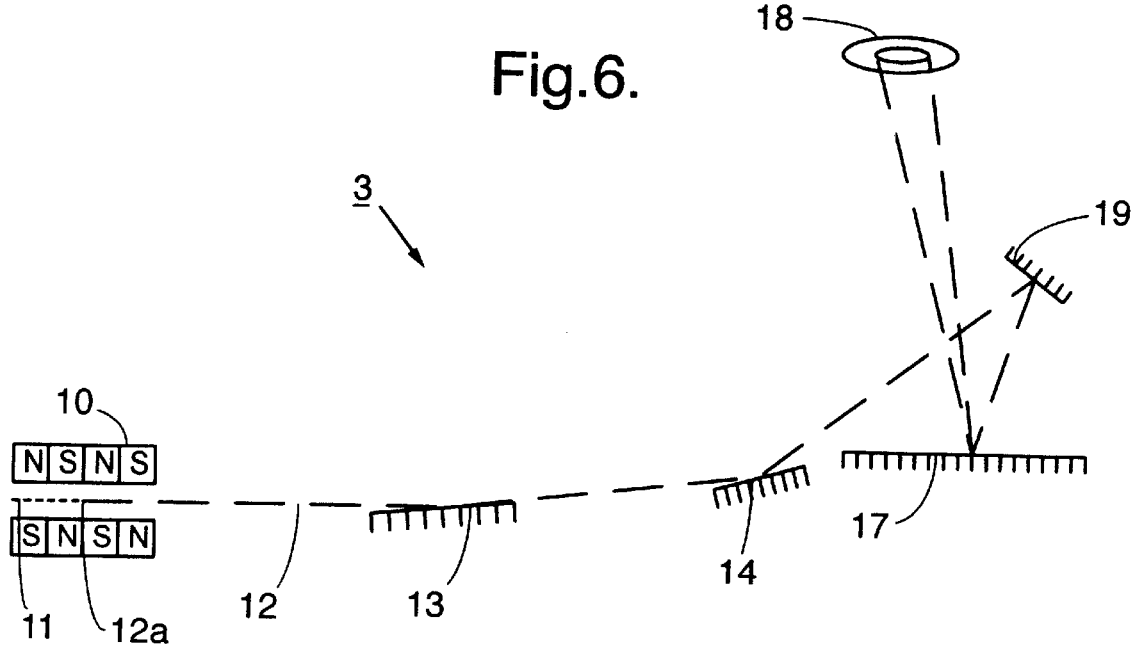
FIG. 6 is a view of relevant components of the illumination optics of a second embodiment of the invention.

In a second embodiment of the invention, shown in FIG. 6, the illumination system 3 is functionally the same as that of the first embodiment but has only three elements. The second relay mirror (15) and second scattering mirror (16) are combined into a single third mirror 19 by superimposing the periodic scattering structure on a curved substrate effective to focus the first scattering mirror onto the entrance pupil 18. This can be done relatively easily, as the radius of curvature of the substrate, i.e. the second relay mirror surface prior to superimposition of the scattering structure, is large.

In the second embodiment, the apparatus arrangement is changed slightly with respect to the first embodiment, as can be seen from a comparison of FIGS. 2 and 6

Embodiment 3

Figure 7:
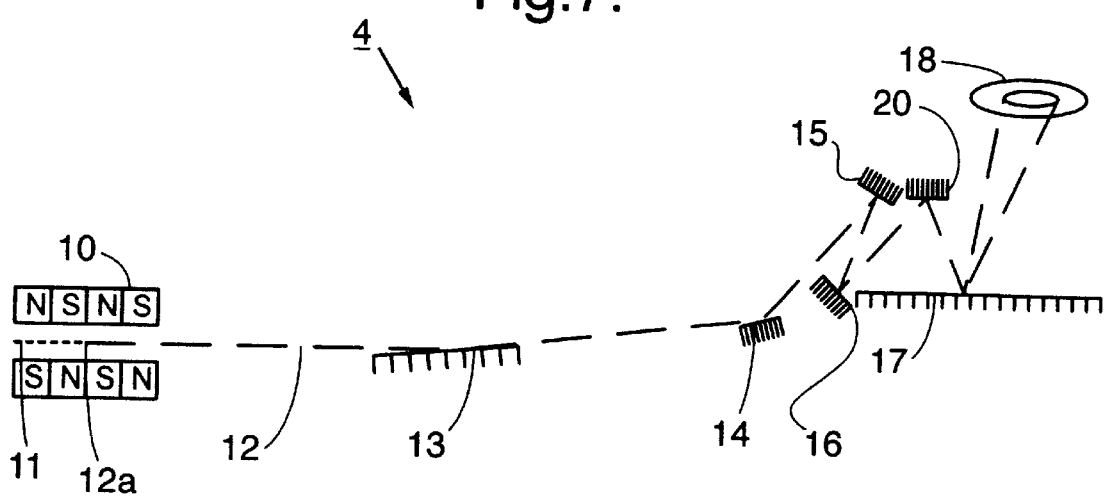
FIG. 7 is a view of relevant components of the illumination optics of a third embodiment of the invention.

In a third embodiment of the invention, illumination system 4 is similar to the illumination system 3 of the second embodiment but includes an additional, third relay mirror 20 and the arrangement of some of the other components is adjusted. As can be seen in FIG. 7, the incident beam is reflected at grazing angles by the first relay mirror 13 and first scattering mirror 14 in the same manner as in the second embodiment described above with reference to FIG. 6. However, in the third embodiment, the beam 12 is incident on the second relay mirror 15 at a near normal-angle to be directed onto second scattering mirror 16, again at a near-normal angle of incidence. Third relay mirror 20 is then provided to bring the shaped beam onto mask 17 at an appropriate angle so that the reflected (pattern bearing) light enters the entrance pupil 18 of the projection system PL as desired.

The third relay mirror is elliptical and images the intermediate image of the first scattering mirror 13 produced by the second relay mirror 15 onto the entrance pupil 18 of the projection system PL. The magnifications of the second and third relay mirrors are selected such that the second scattering mirror 16 is near a conjugate plane of the mask 17. The third relay mirror 20 introduces into the system conjugate planes of the entrance pupil 18 and the mask 17, where pupil and field masks can be placed as desired.

Embodiment 4

Figure 8:
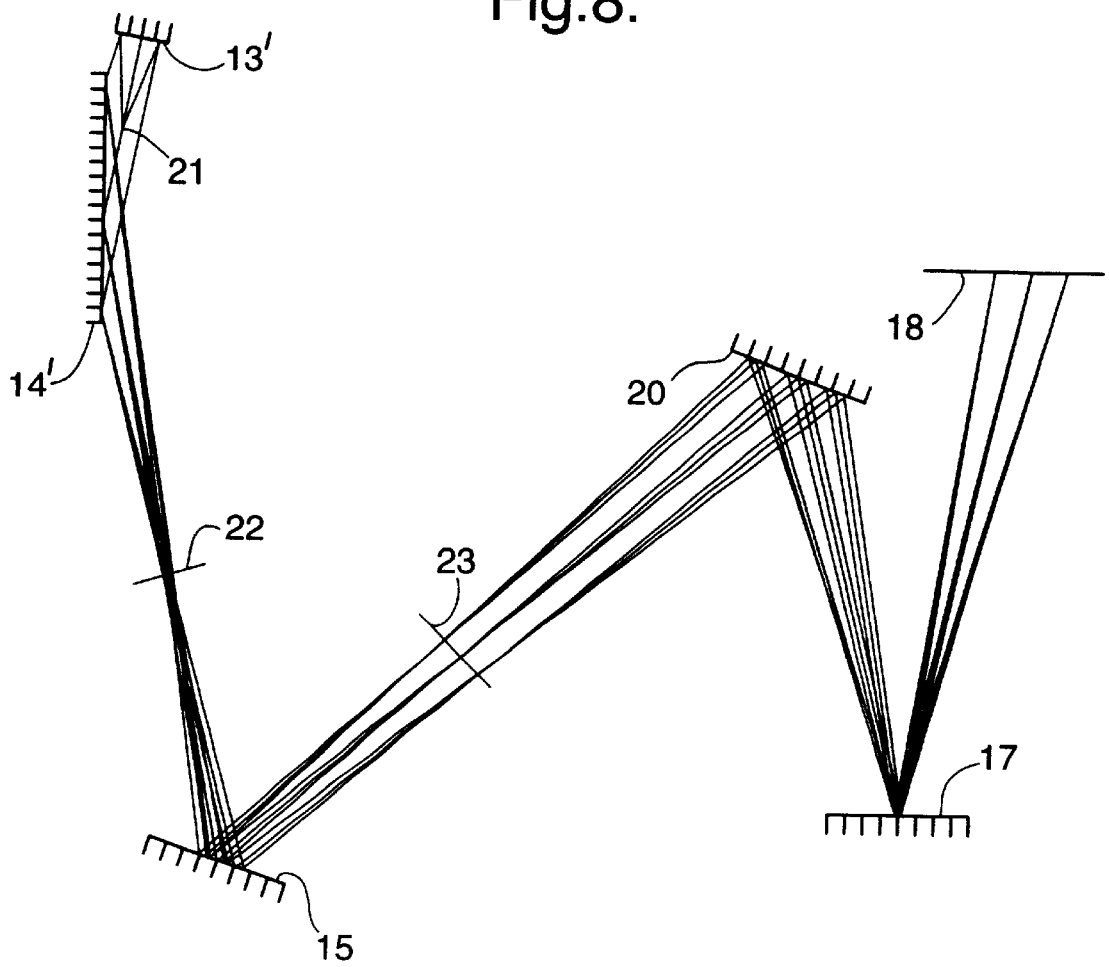
FIG. 8 is a view of relevant components of the illumination optics of a fourth embodiment of the invention.

A fourth embodiment of the invention is shown schematically in FIG. 8. It comprises an illumination system which is more suitable to be used with light sources of a larger étendue (such as laser plasma and other sources alike). In FIG. 8 the source 21 is depicted as a small source with large emission angle. The illumination optics collect the light from the source and direct it to the projection system after reflection at the mask (or reticle). The mask is located at the object plane of the projection system. The illumination of the mask is uniform and has the shape of an arch (ring field). As in the previous embodiments, the reticle is both a field stop of the projection system and an aperture stop of the illumination system. Within the illumination system, there are conjugate planes of the reticle and the entrance pupil of the projection system which are appropriate for positioning field and pupil masks. Along the light path from source to reticle, the illumination system comprises the following components:

collector mirror 13' to collect the light from the source onto scattering mirror 14' scattering mirror 14' to disperse the light in a curved fan and to direct it to an imaginary plane 22 where the different beams generated by the scattering mirror 14' coincide and illuminate uniformly an arch shaped area first relay mirror 15 to image the scattering mirror 14' onto a conjugate plane 23 of the entrance pupil of the projection system second relay mirror 20 to direct the light towards the reticle 17 and to image the scattering mirror 14' onto the entrance pupil of the projection system.

The collector mirror 13' is aspheric (e.g. elliptical) and it must be optimized to collect as much light from the source as possible. For light sources with a large étendue this mirror needs to be a near normal incidence mirror.

The scattering mirror 14' is used at grazing incidence. It is a matrix of mirrors, each one being a one-dimensional array of aspheric mirrors (e.g. cylindrical or toroidal). Each mirror reflects a curved beam. The mirrors in the matrix are tilted and/or rotated so that their reflected beams coincide at a given distance at the imaginary plane 22 and illuminate an arch shaped area (ring field) in this plane uniformly. The shape and dimensions of the arch depend on the incidence angle, the shape and the spacing of the cylindrical or toroidal component of the one-dimensional array.

The imaginary plane 22 where the reflected beams meet is a conjugate plane of the reticle by one or two (as in FIG. 8) of the two relay mirrors which follow the scattering mirror 14'. In FIG. 8 the plane 22 is shown before the first relay mirror, but it could also be behind. Any field masks can be placed at or near this plane 22. For light sources with a small 6tendue a second scattering mirror might be required to control the pupil filling, which mirror should be placed near this surface. In this case the fourth embodiment would be very similar to the third embodiment.

The two relay mirrors 15 and 20 are aspheric mirrors used at near normal incidence. The first relay mirror produces an image of the scattering mirror at an imaginary plane 23, which is a conjugate plane of the entrance pupil of the projection system. Any pupil masks required can be placed at or near this plane 23. Finally, the second relay mirror produces an image of this intermediate conjugate plane 23 onto the entrance pupil of the projection system. Simultaneously, the relay mirrors produce a good image of plane 22 onto the reticle and they preserve the curved shape of the illuminated area so that the illumination of the reticle also has the shape of a ring field. In this system the shapes of the relay mirrors are optimized to provide good imaging between the scattering mirror and the entrance pupil of the projection system and between the reticle and its conjugate plane (plane 23). For instance, they can be elliptical mirrors.

Whilst we have described above specific embodiments of the invention it will be appreciated that the invention may be practiced otherwise than described. The description is not intended to limit the invention.

What is claimed is:

1. A lithographic projection apparatus for imaging a mask pattern in a mask onto a substrate, the apparatus comprising:
   an illumination system constructed and arranged to supply a projection beam of radiation;
   a first object table provided with a mask holder constructed and arranged to hold a mask;
   a second object table provided with a substrate holder constructed and arranged to hold a substrate;
   a projection system constructed and arranged to image an irradiated portion of the mask onto a target portion of the substrate; characterized in that said illumination system comprises:
   a beam scatterer, constructed and arranged to control divergence of said projection beam, said beam scatterer comprising a one-dimensional array of curved reflecting elements, each conforming to a curved surface constructed and arranged to reflect a narrow and collimated incident beam into a curved fan.

2. A lithography apparatus according to claim 1, wherein said curved surface has a curvature substantially greater in a direction of extent of said array than in a direction perpendicular to the direction of extent of said array.

3. A lithography apparatus according to claim 1, wherein said curved surface is of a shape selected from the group consisting of: a part of a cylindrical surface a part of a toroidal surface and a part of a surface of a cone.

4. A lithography apparatus according to claim 1, wherein said scattering means comprises a two-dimensional array of reflectors, each of said reflectors comprising a one dimensional array of curved reflecting elements.

5. A lithography apparatus according to claim 1, wherein central points of said curved reflecting elements all lie on a surface of a shape selected from the group consisting of flat and monotonically curved.

6. A lithography apparatus according to claim 1, wherein said illumination system further comprises further beam scatterers constructed and arranged to control filling of an entrance pupil of said projection system by said projection beam.

7. A lithography apparatus according to claim 6, wherein said further beam scatterers comprise a two-dimensional array of aspherical reflecting elements.

8. A lithography apparatus according to claim 7, wherein said two-dimensional array is an array selected from the group consisting of: a hexagonal array and a square array.

9. A lithography apparatus according to claim 1, wherein said illumination system further comprises a radiation relay constructed and arranged to direct radiation emanating from a radiation source onto said beam scatterer to form said projection beam.

10. A lithography apparatus according to claim 9, wherein said radiation relay is further constructed and arranged to generate an image of said radiation source in the vicinity of the beam scatterer.

11. A lithography apparatus according to claim 9, wherein said radiation relay comprises a toroidal grazing incidence mirror.

12. A lithography apparatus according to claim 9, wherein said illumination system further comprises a second radiation relay disposed behind the beam scatterer and constructed and arranged to direct said projection beam onto the mask.

13. A lithography apparatus according to claim 12, wherein said second relay means is further constructed and arranged to generate an image of said scattering means on the entrance pupil of said projection system.

14. A lithography apparatus according to claim 7,
   wherein said illumination system further comprises a second radiation relay disposed behind the beam scatterer and constructed and arranged to direct said projection beam onto the mask, and
   wherein said second radiation relay and said second beam scatterer together comprise a two-dimensional array of aspherical reflecting elements disposed on a curved substrate.

15. A lithography apparatus according to claim 12, wherein said second radiation relay comprises an elliptical near-normal incidence mirror.

16. A lithography apparatus according to claim 1, further comprising a radiation source selected from the group consisting of: an undulator provided around path of a charged particle beam and a laser plasma source.

17. A lithography apparatus according to claim 1, wherein said projection beam comprises radiation having a wavelength between 9 nm and 20 nm.

18. A device manufacturing method using a lithography apparatus, the method comprising:
   providing a substrate which is at least partially covered by a layer of energy-sensitive material;
   providing a mask containing a pattern;
   using a projection beam of radiation to project an image of at least part of the mask pattern onto a target area of the layer of energy-sensitive material;
   wherein the divergence of said projection beam is controlled in an illumination system of the lithography apparatus using a beam scatterer comprising a one-dimensional array of curved reflecting elements each conforming to a curved surface constructed and arranged to reflect a narrow and collimated incident beam into a curved fan.

19. A device manufactured in accordance with the method of claim 18.

20. An apparatus according to claim 17, wherein said projection beam comprises radiation having a wavelength between 9 nm and 16 nm.

* * * * *